(12) United States Patent
Chen et al.

(10) Patent No.: US 8,067,281 B1
(45) Date of Patent: Nov. 29, 2011

(54) METHOD OF FABRICATING COMPLEMENTARY METAL-OXIDE-SEMICONDUCTOR (CMOS) DEVICE

(75) Inventors: Yi-Wei Chen, Taichung County (TW); Chien-Chung Huang, Taichung County (TW); Nien-Ting Ho, Tainan (TW); Kuo-Chih Lai, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/830,371

(22) Filed: Jul. 5, 2010

(51) Int. Cl.
*H01L 21/8238* (2006.01)

(52) U.S. Cl. ........ 438/218; 438/200; 438/203; 438/253; 438/275; 257/E21.431

(58) Field of Classification Search .................... 438/177
See application file for complete search history.

(56) References Cited

U.S. PATENT DOCUMENTS

2007/0128783 A1* 6/2007 Ting et al. ..................... 438/199

OTHER PUBLICATIONS

Chi Hwan Jang, Dong Ok Shin, Sung Il Baik, Young-Woon Kim, Young-Joo Song, Kyu-Hwan Shim and Nae-Eung Lee, "Formation of Nickel Silicide Layer on Strained-Si0.83Ge0.17/Si(001) using a Sacrificial Si Layer and its Morphological Instability", 2005, vol. 44, pp. 4805-4813, the Japan Society of Applied Physics.

* cited by examiner

*Primary Examiner* — Fernando L Toledo
*Assistant Examiner* — Kyoung Lee
(74) *Attorney, Agent, or Firm* — WPAT., P.C.; Justin King

(57) ABSTRACT

A method of fabricating a CMOS device is provided. First, first and second gates, first and second offset spacers and first and second lightly-doped regions are respectively formed in first and second type metal-oxide-semiconductor regions. A mask layer is respectively formed on the first and second gates. Next, an epitaxial layer is formed in the substrate on two sides of the second gate. Next, first and second spacers, first and second doped regions are formed. Next, a portion of the first spacer is removed to expose a portion of a surface of the first lightly-doped region, thereby forming a first slimmed spacer. Next, a coating layer containing silicon is formed to cover the exposed first lightly-doped region, the first and second doped regions. Next, the mask layer is removed. Next, a metal silicide layer is formed on the first and second gates and the silicon layer.

15 Claims, 10 Drawing Sheets

METHOD OF FABRICATING COMPLEMENTARY METAL-OXIDE-SEMICONDUCTOR (CMOS) DEVICE

BACKGROUND

1. Field of the Invention

The present invention relates to a method of fabricating a CMOS device, and particularly to a method of fabricating a CMOS device that is capable of avoiding a leakage current phenomenon caused by a metal silicide of the CMOS and improving the performance of the CMOS.

2. Description of the Related Art

With the increase of the integrated density of integrated circuits (ICs), the size of semiconductor components is reduced continually. Thus, a technology of fabricating semiconductor component (e.g., a CMOS) will face many challenges.

The CMOS is composed of two transistors including an n-typed metal-oxide-semiconductor (NMOS) transistor and a p-typed metal-oxide-semiconductor (PMOS) transistor. Generally, in order to improve the performance of the PMOS, openings are formed in a silicon substrate on two sides of a gate firstly. Then, a silicon-germanium (SiGe) epitaxial layer is filled in the openings to form a source/drain region. Thus, the mobility of the p-typed carrier in the p-typed channel is increased.

Furthermore, a metal silicide layer, for example, a nickel-silicide (NiSi) layer, is formed on the source/drain region and the gate. The metal silicide layer can be used for improving ohmic contacts between the contacting plug and the gate, and the source/drain region, thereby reducing a signal delay caused by the resistance and the capacitance and reducing a sheet resistance of the source/drain region. Thus, the performance of the CMOS is improved.

However, in a process of fabricating the CMOS, especially the NMOS, the nickel-silicide is prone to transversally diffusing into the silicon substrate and the channel, thereby generating a piping detect and a leakage current. In addition, a segregation of a mass of germanium atoms in the source/drain region of the PMOS will cause an agglomeration of the nickel-silicide, thereby increasing the resistance of the source/drain region and generating the leakage current across a PN-junction in the silicon substrate.

Therefore, what is needed is a method of fabricating a CMOS device to overcome the above disadvantages.

BRIEF SUMMARY

The present invention provides a method of fabricating a CMOS device to improve the performance of the CMOS. The method of fabricating the CMOS device can avoid the piping detect caused by the metal silicide in the NMOS and the segregation of the germanium atoms in the PMOS, thereby avoiding the leakage current and the increase of the resistance.

To achieve the above-mentioned advantages, the present invention provides a method of fabricating a CMOS device. First, an isolating structure is formed in the substrate to define a first type metal-oxide-semiconductor region and a second type metal-oxide-semiconductor region. A first gate, a first offset spacer and a first lightly-doped region are formed in the first type metal-oxide-semiconductor region. A second gate, a second offset spacer and a second lightly-doped region are formed in the second type metal-oxide-semiconductor region. A mask layer is respectively formed on the first gate and the second gate. Next, a portion of the substrate on two sides of the second gate is removed to form a ditch. Next, an epitaxial layer is filled into the ditch. Next, a first spacer is formed on a sidewall of the first gate to cover the first offset spacer, and a second spacer is formed on a sidewall of the second gate to cover the second offset spacer. Next, a doping process is performed to form a first doped region on two sides of the first spacer and to form a second doped region on two sides of the second spacer. Next, a portion of the first spacer is removed to expose a portion of a surface of the first lightly-doped region, thereby forming a slimmed first spacer. Next, a coating layer containing silicon is formed to cover the exposed first lightly-doped region, the first doped region and the second doped region. Next, the mask layer is removed. Next, a metal silicide layer is formed on the first gate, the second gate and the coating layer containing silicon.

In one embodiment provided by the present invention, a material of the coating layer containing silicon is a silicon epitaxial material.

In one embodiment provided by the present invention, a material of the coating layer containing silicon is a silicon-germanium epitaxial material. A percentage of the germanium in the silicon-germanium epitaxial material is less than 10%. In another embodiment, the percentage of the germanium in the silicon-germanium epitaxial material is in a range from 10% to 20%.

In one embodiment provided by the present invention, the coating layer containing silicon is formed by a selective epitaxial growth process.

In one embodiment provided by the present invention, before the coating layer containing silicon is formed, a pre-cleaning process is performed.

In one embodiment provided by the present invention, the step of forming the ditch includes the following steps. First, a protecting layer is formed over the substrate conformably. The protecting layer is a nitride layer. Next, a photoresist layer is formed to cover the protecting layer in the first type metal-oxide-semiconductor region. Next, an etching process is performed by employing the photoresist layer as a mask so as to form a remained protecting layer on the second offset spacer. Next, the photoresist layer is removed. Next, a portion of the substrate is removed by employing the remained protecting layer as a mask so as to form the ditch.

In one embodiment provided by the present invention, the first type metal-oxide-semiconductor region is an N-type metal-oxide-semiconductor region, the second type metal-oxide-semiconductor region is a P-type metal-oxide-semiconductor region, and a material of the epitaxial layer is a silicon-germanium epitaxial material.

In one embodiment provided by the present invention, the epitaxial layer is formed by a selective epitaxial growth process.

In the packaging method of the present invention, before the epitaxial layer is filled into the ditch, a pre-cleaning process is performed.

In the packaging method of the present invention, the portion of the first spacer is removed to form the slimmed first spacer by an etching process.

In the packaging method of the present invention, a material of the metal silicide layer is selected from a group consisting of nickel silicide, tungsten silicide and cobalt silicide.

In the packaging method of the present invention, after the metal silicide layer is formed, a stress memorization technique (SMT) layer is formed over the substrate conformably to cover the first spacer, the second spacer and the metal silicide layer. Then, a dielectric layer is formed on the stress memorization technique layer. Next, a contact hole is formed in the dielectric layer and the stress memorization technique layer so as to expose a portion of the metal silicide layer. Next, a conducting layer is formed to be filled into the contact hole.

In the method of fabricating the CMOS device of the present invention, before the metal silicide layer is formed, a coating layer containing silicon is formed to cover the doped regions. Thus, the piping detect caused by the metal silicide in the NMOS and the segregation of the germanium atoms in the PMOS can be avoided, thereby improving the performance of the CMOS.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

FIG. 1A to FIG. 1J are schematic flow charts of a method of fabricating a CMOS device in accordance with an embodiment of the present invention.

Figure 1A:
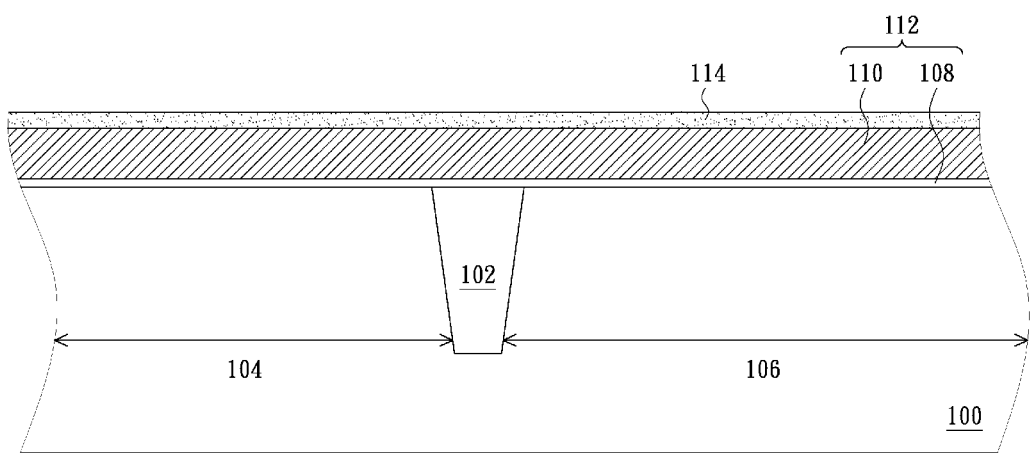
FIG. 1A to FIG. 1J are schematic flow charts of a method of fabricating a CMOS device in accordance with an embodiment of the present invention.

First, referring to FIG. 1A, a substrate 100, for example, a silicon substrate is provided. Next, an isolating structure 102 is formed in the substrate 100 so as to define a first type metal-oxide-semiconductor region 104 and a second type metal-oxide-semiconductor region 106. The isolating structure 102 is, for example, a shallow trench isolation (STI). In the present embodiment, the first type metal-oxide-semiconductor region 104 is, for example, an N-type metal-oxide-semiconductor (NMOS) region, the second type metal-oxide-semiconductor region 106 is, for example, a P-type metal-oxide-semiconductor (PMOS) region. Next, a gate structure layer 112 is formed on the substrate 100. The gate structure layer 112 includes a gate dielectric layer 108 and a gate layer 110. A material of the gate dielectric layer 108 is, for example, silicon oxide, silicon nitride, silicon oxynitride, materials with high dielectric constant such as hafnium dioxide or a combination of the aforesaid materials. The gate dielectric layer 108 is, for example, formed by either a thermal oxidation method or a chemical vapor deposition (CVD) method. A material of the gate layer 110 is, for example, doped polycrystalline silicon, undoped polycrystalline silicon, single crystal silicon, metal, alloy, silicon-germanium material or a combination of the aforesaid materials. The gate layer 110 is, for example, formed by a CVD method.

Next, still referring to FIG. 1A, a mask layer 114 is formed on the gate structure layer 112 to protect the gates in subsequent processes. A material of the mask layer 114 is, for example, silicon nitride. The mask layer 114 is, for example, formed by a CVD method.

Figure 1B:
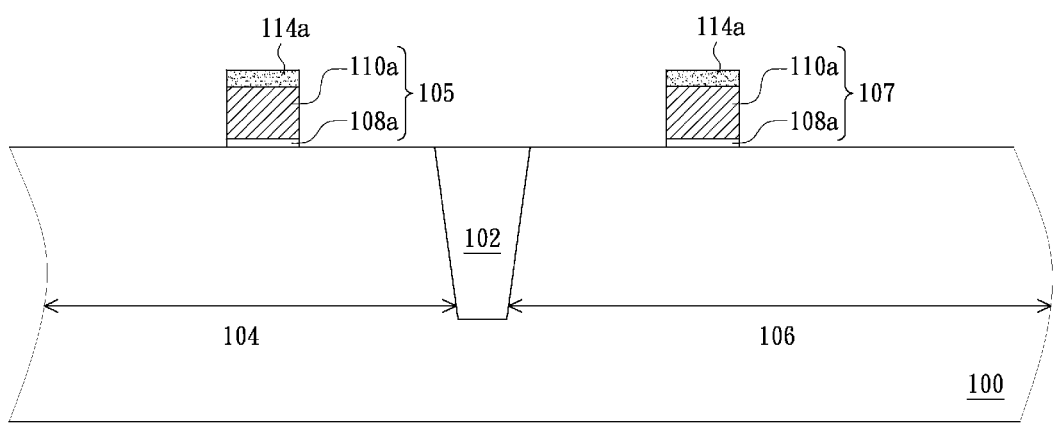

Next, referring to FIG. 1B, the mask layer 114 and the gate structure layer 112 are patterned. Thus, the first gate 105 is formed on the substrate 100 in the first type metal-oxide-semiconductor region 104 and the second gate 107 is formed on the substrate in the second type metal-oxide-semiconductor region 106. The first gate 105 and the second gate 107 respectively include a gate dielectric layer 108a and a gate layer 110a. A mask layer 114a is respectively formed on the first gate 105 and the second gate 107.

Figure 1C:
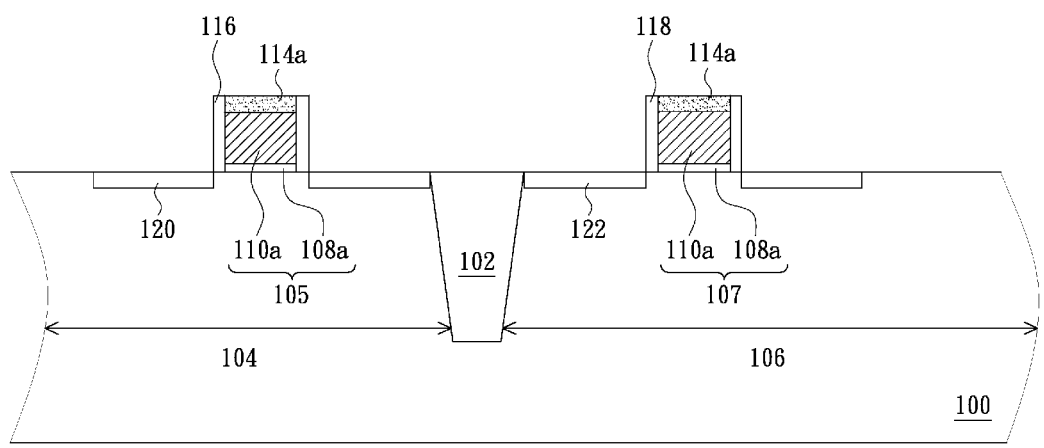
Figure 1D:
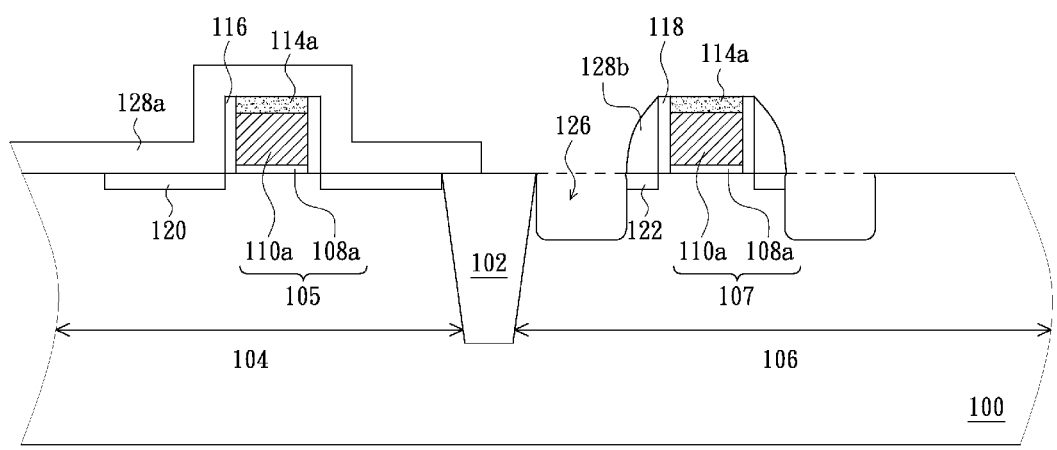
Figure 1E:
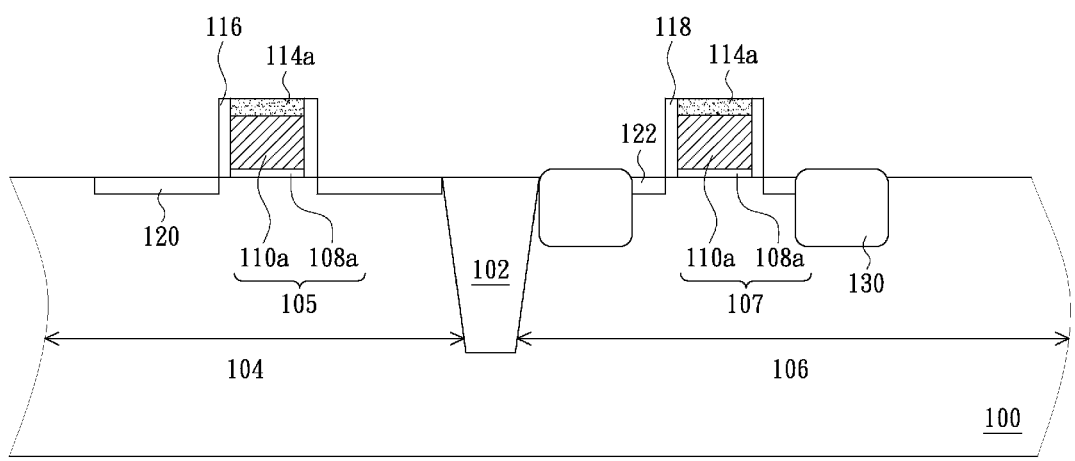
Figure 1F:
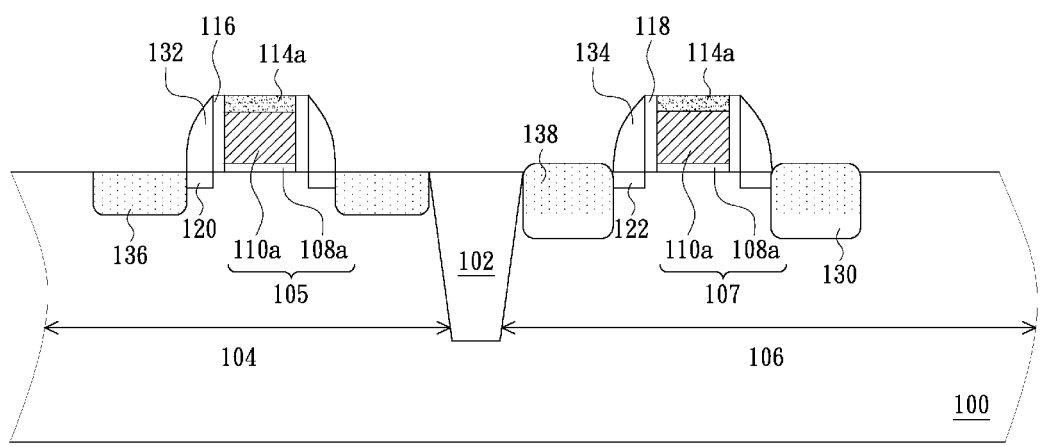
Figure 1G:
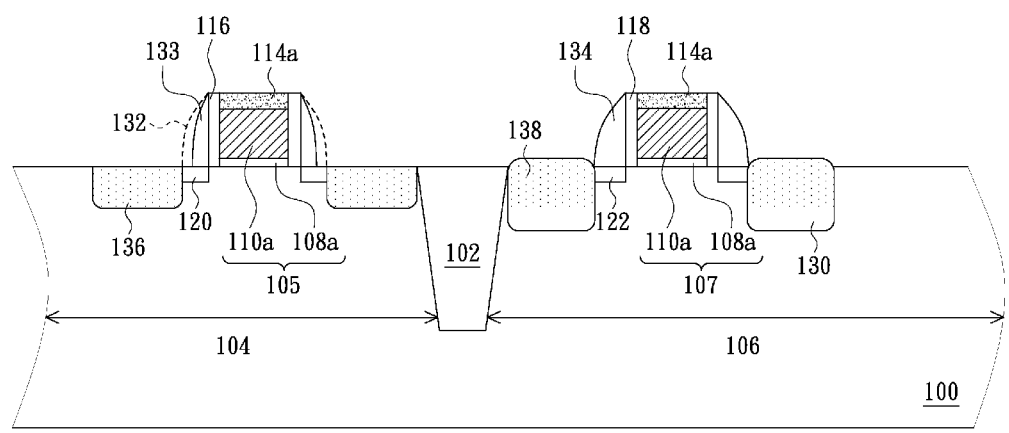
Figure 1H:
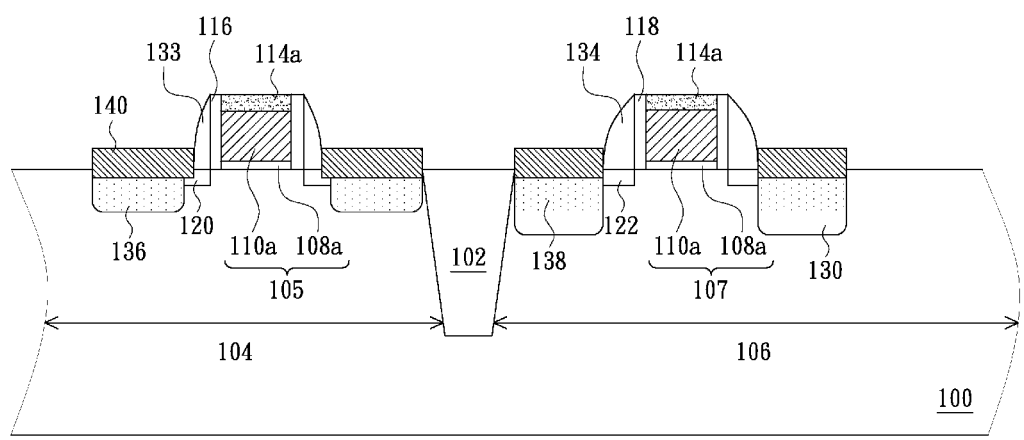

Next, referring to FIG. 1C, a first offset spacer 116 is formed on a sidewall of the first gate 105 and a second offset spacer 118 is formed on a sidewall of the second gate 107. The first offset spacer 116 and the second offset spacer 118 are respectively composed of an oxide layer and a nitride layer. It is noted that the first offset spacer 116 and the second offset spacer 118 can be respectively composed of either a single oxide layer or a single nitride layer. Next, a doping process is performed. Thus, a first lightly-doped region 120 is formed in the substrate 100 on two sides of the first gate 105 and the first offset spacer 116 and a second lightly-doped region 122 is formed in the substrate 100 on two sides of the second gate 107 and the second offset spacer 118. The dopants doped in the first lightly-doped region 120 and the second lightly-doped region 122 can be determined by the types of the first type metal-oxide-semiconductor region 104 and the second type metal-oxide-semiconductor region 106 such as the NMOS or the PMOS.

Next, referring to 1D, a portion of the substrate 100 on two sides of the second gate 107 in the second type metal-oxide-semiconductor region 106 is removed so as to form a ditch 126. In the present embodiment, two ditches 126 are formed. A method of forming the ditch 126 includes, for example, the following steps. First, a protecting material layer (not shown) is formed over the substrate 100 conformably. The protecting layer is, for example, a nitride layer. A material of the nitride layer can be silicon nitride. The protecting layer is, for example, formed by a CVD method. Next, a photoresist layer (not shown) is formed to cover the protecting material layer in the first type metal-oxide-semiconductor region 104. Next, an etching process is performed by employing the photoresist layer as a mask so that a portion of the protecting layer are remained on the second offset spacer 118 in the second type metal-oxide-semiconductor region 106 to form a remained protecting layer 128b. Next, the photoresist layer is removed, and the first type metal-oxide-semiconductor region 104 is still covered by a remained protecting layer 128a. Next, the exposed portion of the substrate 100 in the second type metal-oxide-semiconductor region 106 is removed by employing the remained protecting layers 128a, 128b so as to form the ditch 126. A configuration of the ditch 126 can be different according to the etching method, the etchant, and the etching parameters. For example, the ditch 126 can be, but not limited to, a polygon such as a hexagon, an octagon, and so on. The ditch 126 is, for example, formed by the following steps. At first, a preformed ditch (not shown) is formed by form a dry etching method. And then, the preformed ditch is laterally etched by a wet etching method so as to form the ditch 126 having a predetermined configuration.

Next, referring to 1E, the remained protecting layers 128a, 128b are removed. Next, an epitaxial layer 130 is filled into the ditch 126. A material of the epitaxial layer 130 is a silicon-germanium (SiGe) epitaxial material. The epitaxial layer 130 is, for example, formed by a selective epitaxial growth (SEG) process. Because the epitaxial layer 130 is filled into the ditch 126, the mobility of the p-type carrier in the p-type channel can be increased, thereby improving the performance of the PMOS. In addition, during forming the silicon-germanium epitaxial material layer, a p-type conductive dopant such as boron (B) can be selectively doped. A doping concentration of the p-type conductive dopant in the silicon-germanium epitaxial material layer can be fixed, gradient or irregular. Furthermore, a top surface of the silicon-germanium epitaxial material layer can be higher than a top surface of the substrate 100, or be flush with the top surface of the substrate 100, or be lower than the top surface of the substrate 100. In other embodiment, before the epitaxial layer 130 is filled into the ditch 126, a pre-cleaning process is performed to remove the oxides and the impurities on the substrate 100 at the bottom of the ditch 126.

Next, referring to 1F, a first spacer 132 is formed on a sidewall of the first gate 105 and a second spacer 134 is formed on a sidewall of the second gate 107. A material of the first spacer 132 and a material of the second spacer 134 are, for example, silicon oxide, silicon nitride, silicon silicon oxynitride and a combination thereof. A method of forming the first spacer 132 and the second spacer 134 includes the following steps. First, a spacer layer (not shown) is formed to cover the substrate 100, the mask layer 114a, the first offset spacer 116 and the second offset spacer 118 conformably. Then, an anisotropic etching process is performed so as to remove a portion of the spacer layer, thereby forming the first spacer 132 and the second spacer 134.

Next, referring to 1F, a doping process is performed by employing the mask layer 114a, the first spacer 132 and the second spacer 134 as a mask. Thus, a first doped region 136 is formed in the substrate 100 in the first type metal-oxide-semiconductor region 104, and a second doped region 138 is formed in the epitaxial layer 130 in the second type metal-oxide-semiconductor region 106. The first doped region 136 is on two sides of the first spacer 132 and serves as a source/drain region of the NMOS. The second doped region 138 is on two sides of the second spacer 134 and serves as a source/drain region of the PMOS together with the epitaxial layer 130.

Next, referring to 1G, a portion of the first spacer 132 is removed to form a slimmed first spacer 133. A method of forming the slimmed first spacer 133 includes, for example, the following steps. First, a photoresist layer (not shown) is formed to cover the second type metal-oxide-semiconductor region 106. Then, a slim spacer etching process is performed to remove a portion of the first spacer 132, thereby reducing a width of the first spacer 132. Thus, a portion of a surface of the first lightly-doped region 120 is exposed. The slim spacer etching process can be either a wet etching process or a dry etching process. In the first type metal-oxide-semiconductor region 104, the width of the first spacer 132 is reduced to form the slimmed first spacer 133. Thus, the stress effect caused by the subsequent stress memorization technique layer can be enhanced, thereby increasing a driving current of the CMOS.

Next, referring to 1H, a coating layer containing silicon 140 is formed to cover the exposed first lightly-doped region 120, the first doped region 136 and the second doped region 138. The coating layer containing silicon 140 is, for example, formed by a selective epitaxial growth process. A material of the coating layer containing silicon 140 is, for example, a silicon epitaxial material. Also, the material of the coating layer containing silicon 140 can be a silicon-germanium epitaxial material. A percentage of the germanium in the silicon-germanium epitaxial material is less than 10%. Preferably, the percentage of the germanium in the silicon-germanium epitaxial material is in a range from 10% to 20%. In the present embodiment, because the coating layer containing silicon 140 is formed to cover the exposed first lightly-doped region 120, the first doped region 136 and the second doped region 138, the source/drain region can be extended upwardly to obtain the raised source/drain region, thereby improving the driving ability of the CMOS.

In an embodiment, before the coating layer containing silicon 140 is formed, a pre-cleaning process is performed so as to clean the surfaces of the doped regions (the exposed first lightly-doped region 120, the first doped region 136 and the second doped region 138). Thus, the effect of the oxides and the impurities on the surfaces can be avoided in the selective epitaxial growth process.

Figure 1I:
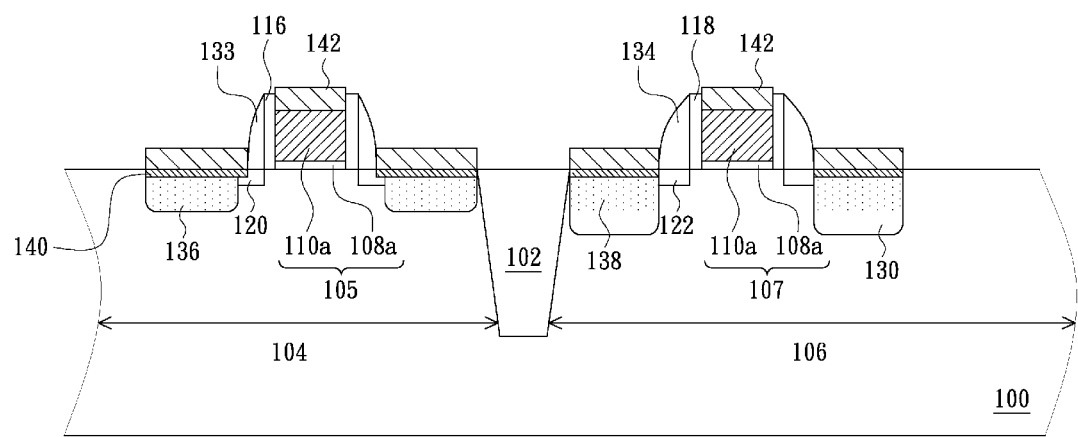

Next, referring to FIG. 1I, the mask layer 114a on the first gate 105 and the second gate 107 is removed by, for example, an etching process. Next, a metal silicide layer 142 is formed on the first gate 105, the second gate 107 and the coating layer containing silicon 140 so as to reduce the resistance. A material of the metal silicide layer 142 can be, for example, nickel silicide, tungsten silicide, cobalt silicide or other metal silicide materials. A method of forming the metal silicide layer 142 is known by one ordinary skilled in the art and is not described here.

In the present embodiment, before the metal silicide layer 142 is formed, the coating layer containing silicon 140 is formed on the doped regions. Thus, the piping detect caused by the metal silicide in the NMOS and the segregation of the germanium atoms in the PMOS can be avoided.

Figure 1J:
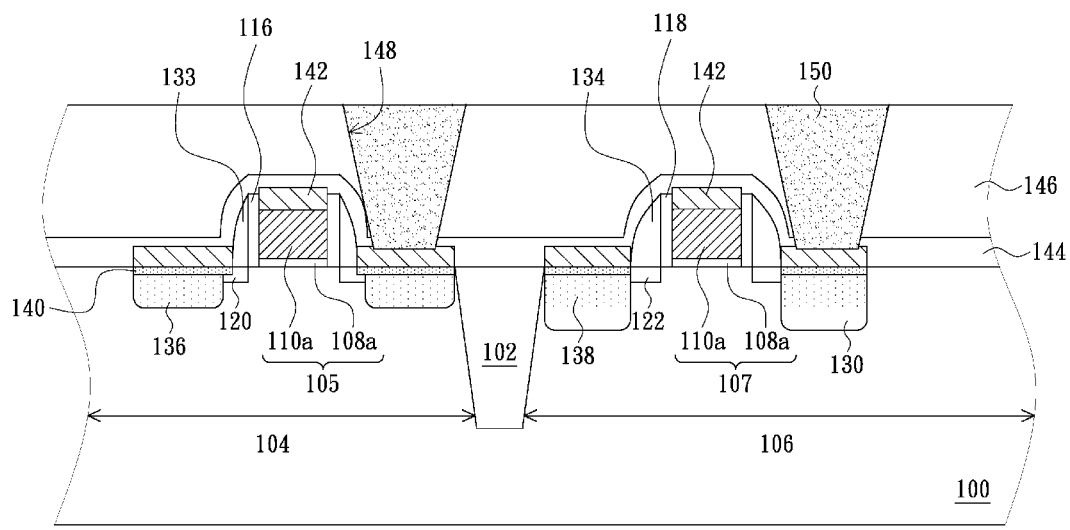

After the above mentioned process is finished, the subsequent interconnecting processes can be performed. Referring to FIG. 1J, the interconnecting processes include, for example, forming a stress memorization technique layer 144 over the substrate 100 conformably so as to over the slimmed first spacer 133, the second spacer 134 and the metal silicide layer 142. A material of the stress memorization technique layer 144 is, for example, silicon nitride. The stress memorization technique layer 144 is formed by a CVD method. Because the stresses needed by the NMOS and the PMOS are different, the stress memorization technique layer 144 formed on the NMOS is different from the stress memorization technique layer 144 formed PMOS. For example, the stress memorization technique layer 144 having tensile stress is formed on the NMOS, and the stress memorization technique layer 144 having compress stress is formed on the PMOS. Next, a dielectric layer 146 is formed on the stress memorization technique layer 144. Next, a contact hole 148 is formed in the dielectric layer 146 and the SMT layer 144 so as to expose a portion of the metal silicide layer 142. Next, a conducting layer 150 is formed to be filled into the contact hole 148 so as to achieve electrically connection.

In summary, the method of fabricating the CMOS device of the present invention can enhance the mobility of the carrier through the silicon-germanium epitaxial layer, increase the stress effect through the slimmed spacer and improve the performance of the CMOS through the metal silicide layer. Furthermore, the method of fabricating the CMOS device of the present invention can avoid the piping detect in the NMOS and the segregation of the germanium atoms in the PMOS.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of fabricating a CMOS device, comprising:
  forming an isolating structure in the substrate to define a first type metal-oxide-semiconductor region and a second type metal-oxide-semiconductor region, wherein a first gate, a first offset spacer and a first lightly-doped region are formed in the first type metal-oxide-semiconductor region, a second gate, a second offset spacer and a second lightly-doped region are formed in the second type metal-oxide-semiconductor region, and a mask layer is respectively formed on the first gate and the second gate;

removing a portion of the substrate on two sides of the second gate to form a ditch;

filling an epitaxial layer into the ditch;

forming a first spacer on a sidewall of the first gate to cover the first offset spacer, and forming a second spacer on a sidewall of the second gate to cover the second offset spacer;

performing a doping process to form a first doped region on two sides of the first spacer and form a second doped region on two sides of the second spacer;

removing a portion of the first spacer to expose a portion of a surface of the first lightly-doped region, thereby forming a first slimmed spacer;

forming a coating layer containing silicon to cover the exposed first lightly-doped region, the first doped region and the second doped region;

removing the mask layer; and forming a metal silicide layer on the first gate, the second gate and the silicon layer.

2. The method of fabricating the CMOS device as claimed in claim 1, wherein a material of the coating layer containing silicon is a silicon epitaxial material.

3. The method of fabricating the CMOS device as claimed in claim 1, wherein a material of the coating layer containing silicon is a silicon-germanium epitaxial material.

4. The method of fabricating the CMOS device as claimed in claim 3, wherein a percentage of the germanium in the silicon-germanium epitaxial material is less than 10%.

5. The method of fabricating the CMOS device as claimed in claim 3, a percentage of the germanium in the silicon-germanium epitaxial material is in a range from 10% to 20%.

6. The method of fabricating the CMOS device as claimed in claim 1, wherein the coating layer containing silicon is formed by a selective epitaxial growth process.

7. The method of fabricating the CMOS device as claimed in claim 1, before the coating layer containing silicon is formed, further comprising performing a pre-cleaning process.

8. The method of fabricating the CMOS device as claimed in claim 1, wherein the step of forming the ditch comprises:

forming a protecting layer over the substrate conformably;

forming a photoresist layer to cover the protecting layer in the first type metal-oxide-semiconductor region;

performing an etching process by employing the photoresist layer as a mask so as to form a remained protecting layer on the second offset spacer;

removing the photoresist layer; and removing a portion of the substrate by employing the remained protecting layer as a mask so as to form the ditch.

9. The method of fabricating the CMOS device as claimed in claim 8, wherein the protecting layer is a nitride layer.

10. The method of fabricating the CMOS device as claimed in claim 1, wherein the first type metal-oxide-semiconductor region is an N-type metal-oxide-semiconductor region, the second type metal-oxide-semiconductor region is a P-type metal-oxide-semiconductor region, and a material of the epitaxial layer is a silicon-germanium epitaxial material.

11. The method of fabricating the CMOS device as claimed in claim 1, wherein the epitaxial layer is formed by a selective epitaxial growth process.

12. The method of fabricating the CMOS device as claimed in claim 1, before the epitaxial layer is filled into the ditch, further comprising performing a pre-cleaning process.

13. The method of fabricating the CMOS device as claimed in claim 1, wherein the portion of the first spacer is removed to form the first slimmed spacer by an etching process.

14. The method of fabricating the CMOS device as claimed in claim 1, wherein a material of the metal silicide layer is selected from a group consisting of nickel silicide, tungsten silicide and cobalt silicide.

15. The method of fabricating the CMOS device as claimed in claim 1, after the metal silicide layer is formed, further comprising:

forming a stress memorization technique layer over the substrate conformably to cover the first spacer, the second spacer and the metal silicide layer;

forming a dielectric layer on the stress memorization technique layer;

forming a contact hole in the dielectric layer and the stress memorization technique layer so as to expose a portion of the metal silicide layer; and forming a conducting layer to fill into the contact hole.

* * * * *